United States Patent [19]

Bogenschütz et al.

[11] Patent Number: 4,913,784
[45] Date of Patent: Apr. 3, 1990

[54] PROCESS FOR METALLIZING A CERAMIC SUBSTRATE

[75] Inventors: August F. Bogenschütz, Oberdischingen; Josef L. Jostan; Robert Ostwald, both of Ulm, all of Fed. Rep. of Germany

[73] Assignee: Licentia Patent-Verwaltungs GmbH, Frankfurt, Fed. Rep. of Germany

[21] Appl. No.: 298,245

[22] Filed: Jan. 12, 1989

Related U.S. Application Data

[63] Continuation of Ser. No. 885,252, Jul. 7, 1986, abandoned, which is a continuation-in-part of Ser. No. 881,100, Jul. 2, 1986, Pat. No. 4,721,549.

[30] Foreign Application Priority Data

Jul. 4, 1985 [DE] Fed. Rep. of Germany ....... 3523958

[51] Int. Cl.⁴ .................... C25D 5/54; C23C 18/18
[52] U.S. Cl. ....................................... 204/29; 204/30; 204/321; 204/38.4; 427/305; 427/309
[58] Field of Search .............. 204/29, 30, 32.1, 38.4; 156/663, 667; 427/309, 305

[56] References Cited

U.S. PATENT DOCUMENTS

| | | | |
|---|---|---|---|
| 4,135,012 | 1/1979 | Su | 427/309 |
| 4,428,986 | 1/1984 | Schachameyer | 427/309 |
| 4,430,170 | 2/1984 | Stern | 204/39 |
| 4,631,114 | 12/1986 | Schneider | 156/663 |
| 4,647,477 | 3/1987 | DeLuca | 427/98 |
| 4,666,744 | 5/1987 | DeLuca et al. | 427/304 |

FOREIGN PATENT DOCUMENTS 0128476 12/1984 European Pat. Off. .
1070369 6/1967 United Kingdom .

OTHER PUBLICATIONS

H. Silman et al, Protective and Decorative Coatings for Metals, Finishing Publications, Ltd., Teddington, Middlesex, England, 1978, pp. 140–141.

F. A. Lowenheim, Electroplating, McGraw-Hill Book Co., New York, 1978, pp. 99–112.

A. Kenneth Graham, Electroplating Engineering Handbook, Reinhold Publishing Corp., New York, 1962, pp. 716–721.

Primary Examiner—John F. Niebling
Assistant Examiner—William T. Leader
Attorney, Agent, or Firm—Spencer & Frank

[57] ABSTRACT

An improved process for metallizing a ceramic substrate for the purpose of producing a metal layer having uniformly good adhesion as measured by peel strength. The improvement is a pretreatment process in which the firing skin, i.e., the glass-like surface of the ceramic substrate is removed and the exposed surface of the ceramic substrate is positively roughened. The pretreatment includes a chemical etching step during which the ceramic substrate contacts a melt bath containing molten alkali hydroxide and an additive, which additive preferably is water. From 0.01 to 80 weight %, preferably from 1 to 5 weight %, of water is included in the melt bath. Rather than reducing the etching rate because of dilution, the rate increased unexpectedly. Moreover, the metallization resulted in a metal layer having very good adhesion, which adhesion can be further improved by chemically etching the ceramic substrate under a protective gas atmosphere, preferably a wet protective gas atmosphere.

12 Claims, 1 Drawing Sheet

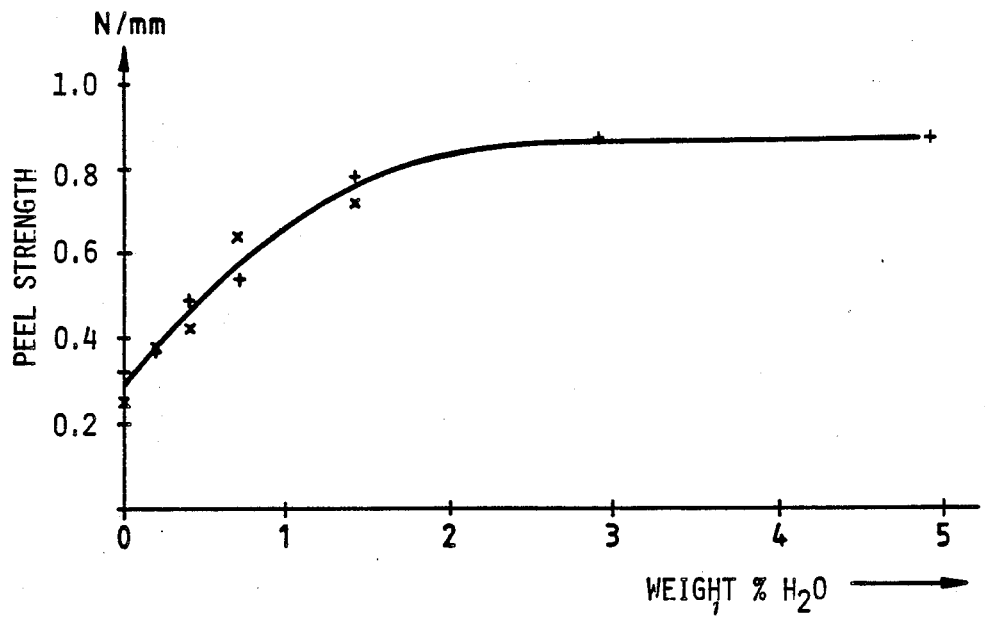

PROCESS FOR METALLIZING A CERAMIC SUBSTRATE

This application is a continuation of application Ser. No. 06/885,252, filed July 7, 1986, now continuation, which is a continuation-in-part of application Ser. No. 06/881,100, filed July 2, 1986, now U.S. Pat. No. 4,721,549 issued Jan. 26, 1988.

BACKGROUND OF THE INVENTION

1. Field of the Invention

The present invention relates to a method for chemically treating ceramic substrates prior to metallization thereof in order to provide at least one electrical circuit thereon and, in particular, to treating ceramic substrates prior to metallization with an alkali hydroxide melt.

2. Background of the Art

Ceramic substrates are metallized in order to change, improve, or supplement the decorative and/or functional characteristics of the ceramic objects, such characteristics including electrical and/or thermal conductivity, resistance to corrosion, and resistance to wear. For whatever reason metallized, the adhesion of the metal coating on the ceramic material is always of particular significance. Very generally speaking, the adhesion of the layers is produced either by a relatively weak interaction between the material of the layer and the substrate (so-called Van der Waals forces), by chemical bonding, by mechanical anchoring, or by a combination of these contributory factors. The contribution made to layer adhesion by these individual factors depends to a special degree on the type of pretreatment received by the ceramic substrate and on the metallization system selected.

Several processes are known for the metallization of ceramic substrates, including thick film and thin film techniques. Ceramic plates for circuit boards and the like may be provided with thick film circuits by thick film techniques, such as, the well known screen-printing of noble metal pastes thereon followed by a burn-in. Circuit board art and the like also include techniques for providing so-called thin film circuits by way of vacuum vapor deposition or cathode sputtering. These processes, however, are limited to certain applications, in part because they are expensive and because of various process-specific unfavorable characteristics of the metallizations produced thereby. For example, the thin film technique for producing gold or copper layers, requires the use of adhesion-promoting intermediate layers of chromium, titanium or molybdenum, which can behave as impurity. The thick film technique is frequently characterized by a considerable reduction in the conductivity of the conductor materials because of embedded glass components and, moreover, because of the screen-printing step, the path width of the conductor materials cannot be made significantly smaller than about 200 microns.

In the past, many attempts have been made to apply conductors of a pure metal, particularly copper, directly to ceramic surfaces. Pure metal conductors have greater conductivity and therefore require a smaller conductor path cross-section. One such process is based on electroless deposition, i.e., the currentless chemical precipitation, of copper on a ceramic surface previously covered with catalytically active nuclei capable of catalyzing the electroless precipitation of metals thereon from a chemical bath. In this prior art process, the adhesion of the copper layers is generally insufficient or the copper layers are too faulty to be suitable for the reliable production of conductor path patterns having fine structural configurations, because of pinholes and/or a tendency to blister and peel.

SUMMARY OF THE INVENTION

Based on this state of the art, it is an object of the present invention to provide an improved process for the metallization of ceramic substrates, whether metallization is achieved by a physical process or a chemical process, whereby a uniform and well-adhering metal layer, such as a copper layer, is provided in an economical and reliable manner.

It is a further object of the present invention to provide a metal layer on a ceramic substrate by a method including electroless precipitation of a first metal layer and electrolytic precipitation of a second, reinforcing metal layer, the result of which is a metallization layer having a peel strength of at least 0.4 N/mm and which, while maintaining this peel strength, permits the formation of conductor path patterns having fine structural configurations which are particularly useful in the industrial mass production of circuit boards.

These and other objects are accomplished by providing a process for metallizing a ceramic substrate wherein a ceramic substrate having a firing skin is preheated to a temperature effective to prevent thermal shock thereto when subsequently contacted by a melt bath. The preheated ceramic substrate is chemically etched with a melt bath containing molten alkali hydroxide and an additive for from 1 second to 10 hours, preferably 1 to 30 minutes, whereby the firing skin of the ceramic substrate is removed and the substrate is surface-roughened, the chemical etching taking place under a protective gas atmosphere. The etched ceramic substrate is rinsed with a solvent and dried to remove the solvent. The etched ceramic substrate is then metallized by either a physical metallization process or a chemical metallization process.

When the etched ceramic substrate is to be metallized by a chemical metallization process wherein a catalytic germination layer is provided on the ceramic substrate, which layer is capable of catalyzing electroless precipitation of metals thereon; a first electrically conductive layer is precipitated onto the catalytic germination layer by electroless precipitation from a chemical bath; and a second electrically conductive metal layer is electrolytically precipitated onto the first layer from an electrolytic bath, which first layer functions as an electrode, a second embodiment according to the present invention provides an improved process wherein a melt bath comprised of molten alkali hydroxide and from 0.01 to 80 percent by weight water is provided. A ceramic substrate to be metallized is preheated to a temperature effective to at least mitigate thermal shock thereto when subsequently contacted by a melt bath, the ceramic substrate having a firing skin. The preheated ceramic substrate is chemically etched by contacting same with the melt bath for from 1 second to 10 hours, preferably from 1 to 30 minutes, to remove the firing skin and surface-roughen the substrate. The etched ceramic substrate is rinsed with a solvent and dried to remove the solvent.

When, as in the preceding paragraph, a ceramic substrate is to be metallized using the electroless/electrolytic techniques, a third embodiment according to the present invention provides an improved process wherein a melt bath comprised of molten alkali hydroxide and from 0.01 to 80 percent by weight water is provided. A ceramic substrate to be metallized is preheated to a temperature ranging from the temperature effective to at least mitigate thermal shock thereto when subsequently contacted by the melt bath to the temperature of the melt bath, the ceramic substrate having a firing skin. The preheated ceramic substrate is chemically etched by contacting same with the melt bath for from 1 second to 10 hours, preferably from 1 to 30 minutes, under a protective atmosphere comprised of inert gas selected from the group consisting of nitrogen, a noble gas, a mixture of noble gases, and mixtures thereof, and water vapor, which water vapor has a partial pressure ranging from 0.001 atm up to saturation level, whereby the firing skin of the ceramic substrate is removed and the substrate is surface-roughened. The etched ceramic substrate is rinsed in a solvent and dried to remove the solvent.

In any of the foregoing embodiments of the process according to the present invention, the ceramic substrate may be advantageously preheated to a temperature which ranges up to but does not exceed the temperature of the melt bath. Additives for the melt bath may be selected from among substances which reduce the melting point of the melt bath, which increase the chemical etching rate, and which improve the solubility of etching products formed during the chemical etching of the preheated ceramic substrate with the melt bath. Preferably, the at least one additive contained in the melt bath comprises water and the melt bath comprises from 0.01 to 80 weight % of water, preferably from 1 to 5 weight percent.

The treatment of the preheated ceramic substrate with a melt bath may be accomplished by immersion in the melt bath, by dipping into the melt bath, by spraying with the melt bath, by rolling the melt bath thereover, or by other mechanical procedures which would be readily apparent to the artisan. Although a time period for chemically etching the preheated ceramic substrate may range from 1 second to 10 hours, the preferred etching time ranges from 1 minute to 30 minutes.

Preferably chemical etching is effected under a protective gas atmosphere comprised of inert gas selected from the group consisting of nitrogen, a noble gas, a mixture of noble gases, and mixtures thereof. Most preferably the protective atmosphere further comprises water vapor having a partial pressure ranging from 0.01 atm up to the saturation level and especially from 0.23 atm up to the saturation level for a melt consisting essentially of sodium hydroxide and from 1 to 5 weight % water.

Any of the embodiments according to the invention may further comprise a heating step in which the treated ceramic substrate is heated to a temperature ranging from the temperature of the melt bath but below that at which the ceramic substrate begins to melt, prior to the rinsing step. Preferably, the heating step is effected under a protective gas atmosphere. Similarly, any of the embodiments may further comprise a chemical treating step in which the etched ceramic substrate is contacted with a solution having a pH ranging from 8 to 11, prior to the rinsing step. Further, in the rinsing and drying steps which follow, the solvent may be demineralized water and the drying may take place in a stream of dry nitrogen.

The ceramic substrate may be comprises of substances selected from the group consisting of oxides, nitrides, carbides, borides and silicides.

In a chemical metallization process of the electroless/electrolytic type, uniform and reliably high occupation density of catalytic nuclei in the catalytic germination layer and uniformly high adhesion of the metal layer, such as a copper layer, deposited by electroless precipitation and reinforced electrolytically, depend decisively on the process improvement according to the present invention. The same is generally true regardless of whether the metallization process is a physical metallization process or a chemical metallization process. The present invention is thus based on this realization and, accordingly, the disclosed pretreatment embodiments for ceramic substrates provide great reproducibility with respect to cleaning ability, wetting ability, and etching attack upon the ceramic surface to be roughened.

BRIEF DESCRIPTION OF THE DRAWING

The sole FIGURE is a graph showing peel strength measured in N/mm of copper metal layers provided on ceramic substrates according to the process improvement of the present invention combined with electroless/electrolytic metallization techniques as a function of the water content of the melt bath in the inventive chemical etching step.

DESCRIPTION OF THE PREFERRED EMBODIMENTS

The invention will now be described in greater detail in connection with the embodiments and with reference to the drawing.

Ceramic surfaces have a so-called firing skin, which is a glass-like surface layer and makes most types of ceramic materials relatively chemically inert. Removal of the firing skin in a reproducible manner requires a suitable process. Such a suitable process should clean and activate the ceramic surfaces preferably by a chemical removal technique so that chemical bonds can be developed between the surfaces of the ceramic crystals that have been exposed and a subsequently applied metal layer. However, this removal process must neither excessively roughen the surfaces nor loosen the structure of the material since otherwise the necessary mechanical attachments would break away too easily. A chemical etching technique which primarily removes the glass-like firing skin is therefore most suitable for this purpose.

A number of etching agents are known in the literature (see, for example, R. Bock: Aufschlussmethoden der anorganischen und organischen Chemie [Decomposition Methods Used in Organic and Inorganic Chemistry], published by Verlag Chemie, Weinheim/Bergstrasse, 1972) for treatment of aluminum oxide. Aluminum oxide is the ceramic substrate material most commonly used in the electrical/electronic art. Examples of these etching agents include acids, such as phosphoric acid, sulfuric acid, nitric acid and hydrofluoric acid, and bases, such as ammonium hydrogen fluoride, a sodium hydroxide solution and a sodium hydroxide melt. On the one hand, the acids have been found to be generally lacking in efficiency. The bases, on the other hand, attack the ceramic surfaces only at a very high temperature, and then too strongly and/or irregularly.

German Laid-Open Patent Application Number 3,150,399, for example, discloses a pretreatment employing immersion in a sodium hydroxide solution. A layer produced in this manner, however, must first be dried (the danger of carbonate formation therefore existing) and must then be fired at a very high temperature (approximately 500° C), the small quantities of alkali hydroxide therefore being distributed unevenly and quickly proceeding through their reaction with the substrate so that no further etching can take place.

In a pretreatment method employing immersion in a melt of sodium hydroxide, etching action is similarly relatively weak. Further, no significant increase in the strength of the etching action takes place, even if the temperature is increased above the melting point of NaOH (Mp = 318° C.).

The present inventors discovered that the etching attack of a NaOH melt could be increased considerably and in a surprising manner by including therein a relatively low water content. Rather than reducing the etching action because of dilution, the etching rate was increased. It was also discovered that the increased etching action caused the ceramic surface to become much more uniformly roughened and roughened to a greater extent, thus increasing the percentage of mechanical anchoring sites and producing a significant increase in the adhesion of the metallization layer. Further, the degree of roughening was found to be controllable quite well by adjusting the water content of the melt.

To measure the adhesion of copper layers provided on $Al_2O_3$ ceramic substrates after the pretreatment according to the present invention, 1 mm wide strips of the metal layer on the substrate were prepared by photoetching. The force required to vertically peel away these metal strips was measured with a tensile strength testing machine. The drawing shows a graph of peel strengths measured in N/mm as a function of the water content, measured in weight %, of the sodium hydroxide melt used for the chemical etching step according to the present pretreatment improvement. By increasing the etching action by including even slight amounts of water in the NaOH melt, an increase in adhesion of the subsequently provided metal layer results. For example, if t content is raised from 0 to about 2%, an increase in adhesion results for 15 micron thick copper layers of from 0.3 N/mm to more than 0.8 N/mm, respectively. This metal layer thickness of 15 microns was maintained constant for all peel strength measurements.

The reason that alkali hydroxide melts attack ceramic substrates, as exemplified by the attack of the NaOH melt on the $Al_2O_3$ ceramic substrate above, is that the chemical activity of the hydroxide melt increases over a given range with increasing water content. This is clearly shown in the drawing. Similarly, the solubility of the reaction products, the products of the etching action, for example, the aluminate which forms according to the following equation, require the presence of water:

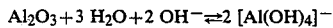
$$Al_2O_3 + 3\ H_2O + 2\ OH^- \rightleftharpoons 2\ [Al(OH)_4]^-$$

With respect to its water content, an alkali hydroxide melt, such as a NaOH melt, is in equilibrium with the water vapor content of the atmosphere disposed above the melt. In normal room air, this water vapor content is so low that the water content of the melt in equilibrium at a temperature of 318° C. is at most 0.1 percent. This low water content is consumed immediately during etching of, for example, aluminum oxide to form the aluminate, so that further etching proceeds in a melt freed of water only with very unsatisfactory results.

It was discovered that an alkali hydroxide melt, such as an NaOH melt, containing a few percent of water and used fresh, produced very good roughening, however, its effect was difficult to reproduce. A constant and at the same time increased water content in an alkali hydroxide melt, however, can be realized by providing a gas atmosphere having a high water vapor partial pressure above the melt. If, in addition to providing this wet atmosphere, care is simultaneously taken that no carbon dioxide is allowed to enter the melt, carbonate formation is also effectively prevented. The present pretreatment process embodiments can also be implemented with equal success with other alkali hydroxides, or example, LiOH, KOH and mixtures thereof.

Sensitive ceramic parts can be protected against breakage due to stresses from temperature shocks and the etching rate by preheating the ceramic substrates prior to treatment thereof in the alkali hydroxide melt. More specifically, the reproducibility of the etching step can be further improved by preheating the ceramic substrates, the preheating taking place preferably in a protective gas atmosphere.

The invention will now be described in greater detail with reference to the following examples:

EXAMPLE 1:

Demonstration of the advantage of etching in a water-containing, alkali hydroxide melt Aluminum oxide ceramic substrates for thin film circuits composed of 99.5% $Al_2O_3$, having the dimensions of 50.8 x 25.4 x 0.6 mm3, and having an average roughness of 0.25 micron were preheated to a temperature of 250° C. in a drying oven. A melt was produced from small sodium hydroxide plates and 5 % water and was homogeneous at 330° C. The preheated substrates were immersed in this melt for 20 minutes. After pulling the ceramic substrates out of the melt and cooling them, they were treated in a 2% sodium hydroxide solution and were subsequently thoroughly rinsed under running, demineralized water with ultrasonic agitation. The samples were dried and exhibited an average roughness of about 0.5 micron. Drying took place in a stream of dry nitrogen at a rate of about 5 l/sec, and the protective atmosphere above the melt consisted of nitrogen, too.

For the purpose of a subsequent electroless metallization, the substrates were successively dipped into a tin(II) chloride solution, into water, and into a palladium chloride solution and ultimately rinsed in water so as to cover them, in the well-known manner, with catalytic nuclei. Then, a first copper layer having a thickness of approximately 0.3 microns was deposited by electroless, i.e., currentless chemical means, from a commercially-available chemical copper-formaldehyde bath. After rinsing, the first copper layer was reinforced to about 15 microns by electrolytically depositing a second copper layer thereon from a commercially-available copper sulfate electrochemical bath.

To test the adhesion, as before, photolithographic techniques were used to provide 1 mm wide metal strips on the ceramic substrate. A tensile strength testing machine measured the force required to vertically peel away these strips. A peel strength of about 0.7 N/mm was measured and the adhesion was uniform. Without pretreatment in a water-containing NaOH melt according to the present invention, the adhesion of copper layers is not uniform and has at most a peel strength of 0.1 N/mm.

EXAMPLE 2

Demonstration of the advantage of etching under a wet nitrogen atmosphere

Aluminum oxide ceramic substrates according to Example 1, were preheated to 250° C. The preheated substrates were then immersed in a sodium hydroxide melt over which a stream of nitrogen saturated with water vapor had previously been conducted for two hours. This stream had been produced by heating nitrogen to a temperature of 300° C. in a heated tube and conducting it over boiling water. The temperature of the melt was 320° C. after rinsing and drying, the treated ceramic substrates had an average roughness of approximately 1.0 micron. After these substrates had been nucleated, i.e., covered with catalytic nuclei as in Example 1, they were premetallized with approximately 0.1 micron of nickel phosphorus from a commercially available nickel hypophosphite bath. After rinsing, the nickel phosphorus layers were electrolytically reinforced in a copper sulfate bath to provide a copper layer thereon having a layer thickness of about 15 microns. After producing 1 mm peel strength test strips by photolithographic techniques as in Example 1, peel strengths of 0.9 N/mm were measured.

The present disclosure relates to the subject matter disclosed in German Patent P 35 23 958.1 of July 4th, 1985, the entire specification of which is incorporated herein by reference.

It will be understood that the above description of the present invention is susceptible to various modifications, changes and adaptations, and the same are intended to be comprehended within the meaning and range of equivalents of the appended claims.

What is claimed is:

1. A process for metallizing a ceramic substrate comprising:
   a. preheating a ceramic substrate having a firing skin to a temperature effective to at least mitigate thermal shock thereto when subsequently contacted by a melt bath;
   b. chemically etching the preheated ceramic substrate with a melt bath consisting essentially of molten sodium hydroxide and from 1 to 5 weight % water for from 1 second to 10 hours to provide an etched ceramic substrate, whereby the firing skin of the ceramic substrate is removed and the substrate is surface-roughened, the chemical etching taking place under a protective gas atmosphere comprised of an inert gas and water vapor to maintain a water vapor partial pressure ranging from 0.23 atm up to saturation level;
   c. chemically treating the etched ceramic substrate with a solution having a pH ranging from 8 to 11 to provide an etched and treated ceramic substrate.
   d. rinsing the etched and treated ceramic substrate in a solvent and drying to remove the solvent to provide a rinsed, dried and etched ceramic substrate; and
   e. metallizing the rinsed, dried and etched ceramic substrate.

2. The process according to claim 1 wherein the ceramic substrate is preheated to a temperature which ranges up to but does not exceed the temperature of the melt bath.

3. The process according to claim 1, wherein the metal bath further comprises at least one additive selected from substances which reduce the melting point of the melt bath, which substances are present in at least an amount effective to reduce the melting point of the melt bath.

4. The process according to claim 1, wherein the preheated ceramic substrate is chemically etched for from 1 to 30 minutes.

5. The process according to claim 1, wherein the step of chemically etching the preheated ceramic substrate is accomplished by one of immersion in the melt bath, dipping into the melt bath, spraying with the melt bath, and rolling the melt bath thereover.

6. The process according to claim 1, wherein the protective gas atmosphere is comprised of an inert gas selected from the group consisting of nitrogen, a noble gas, a mixture of noble gases, and mixtures thereof.

7. The process according to claim 1, including the further step of heating the etched ceramic substrate to a temperature ranging from the temperature of the melt bath up to but below that at which the ceramic substrate begins to melt, prior to the rinsing step.

8. The process according to claim 1, wherein the solvent for rinsing the etched ceramic substrate is demineralized water and drying to remove the solvent takes place in a stream of dry nitrogen.

9. The process according to claim 1, wherein the etched ceramic substrate is metallized by a chemical metallization process comprising:
   providing a catalytic germination layer on the ceramic substrate, which layer is capable of catalyzing electroless precipitation of metals thereon;
   precipitating a first electrically conductive metal layer onto the catalytic germination layer by electroless precipitation from a chemical bath;
   and electrolytically precipitating a second electrically conductive metal layer onto the first layer from an electrolytic bath.

10. The process according to claim 1, wherein the ceramic substrate is comprised of a material selected from the group consisting of oxides, nitrides, carbides, borides and silicides.

11. In a chemical process for metallizing a ceramic substrate including the steps of providing a catalytic germination layer on the ceramic substrate, which layer is capable of catalyzing electroless precipitation of metals thereon; precipitating a first electrically conductive metal layer onto the catalytic germination layer by electroless precipitation from a chemical bath; and electrolytically precipitating a second electrically conductive metal layer onto the first layer from an electrolytic bath, the improvement comprising a pretreatment, prior to the step of providing the catalytic germination layer, including:
   a. providing a melt bath consisting essentially of molten sodium hydroxide and from 1 to 5 percent by weight water;
   b. preheating a ceramic substrate to be metallized to a temperature effective to at least mitigate thermal shock thereto when subsequently contacted by the melt bath, the ceramic substrate having a firing skin;
   c. chemically etching the preheated ceramic substrate by contacting same with the melt bath for from 1 second to 10 hours under a protective gas atmosphere comprised of an inert gas and water vapor to maintain a water vapor partial pressure ranging from 0.234 atm up to saturation level, to remove the firing skin and surface-roughen the substrate to provide an etched ceramic substrate;

d. chemically treating the etched ceramic substrate with a solution having a pH ranging from 8 to 11 to provide an etched and treated ceramic substrate; and rinsing the etched and treated ceramic substrate with a solvent and drying to remove the solvent.

12. In a chemical process for metallizing a ceramic substrate including the steps of providing a catalytic germination layer on the ceramic substrate, which layer is capable of catalyzing electroless precipitation of metal thereon; precipitating a first electrically conductive metal layer onto the catalytic germination layer by electroless precipitation from a chemical bath; and electrolytically precipitating a second electrically conductive metal layer onto the first layer from an electrolytic bath, the improvement comprising a pretreatment, prior to the step of providing the catalytic germination layer, including:

a. providing a melt bath consisting essentially of molten sodium hydroxide and from 1 to 5 percent by weight water;

b. preheating a ceramic substrate to be metallized to a temperature effective to at least mitigate thermal shock thereto when subsequently contacted by the melt bath, the ceramic substrate having a firing skin;

c. chemically etching the preheated ceramic substrate with the melt bath for from 1 second to 10 hours under a protective atmosphere comprised of inert gas selected from the group consisting of nitrogen, a noble gas, a mixture of noble gases, and mixtures thereof, and water vapor, which water vapor has a partial pressure ranging from 0.23 atm up to saturation level, to provide an etched ceramic substrate whereby the firing skin of the ceramic substrate is removed and the substrate is surface-roughened;

d. chemically treating the etched ceramic substrate with a solution having a pH ranging from 8 to 11 to provide an etched and treated ceramic substrate; and e. rinsing the etched and treated ceramic substrate with a solvent and drying to remove the solvent.

* * * * *